United States Patent
Okamae et al.

(10) Patent No.: US 10,153,244 B2
(45) Date of Patent: Dec. 11, 2018

(54) DISPLAY DEVICE

(71) Applicant: Japan Display Inc., Tokyo (JP)

(72) Inventors: Tetsuya Okamae, Tokyo (JP); Shinji Yamakawa, Tokyo (JP); Kazuyuki Sunohara, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/468,244

(22) Filed: Mar. 24, 2017

(65) Prior Publication Data
US 2017/0285376 A1   Oct. 5, 2017

(30) Foreign Application Priority Data
Mar. 31, 2016  (JP) ................. 2016-073038

(51) Int. Cl.
| | |
|---|---|
| H01L 27/12 | (2006.01) |
| H01L 23/00 | (2006.01) |
| H01L 25/18 | (2006.01) |
| G02F 1/1345 | (2006.01) |
| G09G 3/00 | (2006.01) |
| G09G 3/36 | (2006.01) |
| G02F 1/1362 | (2006.01) |

(52) U.S. Cl.
CPC .............. *H01L 24/17* (2013.01); *H01L 25/18* (2013.01); *H01L 27/124* (2013.01); *G02F 1/13452* (2013.01); *G02F 2001/136254* (2013.01); *G09G 3/006* (2013.01); *G09G 3/3648* (2013.01); *G09G 2300/0413* (2013.01); *G09G 2300/0426* (2013.01); *H01L 2224/16145* (2013.01); *H01L 2924/13069* (2013.01); *H01L 2924/1426* (2013.01)

(58) Field of Classification Search
CPC ... G02F 1/1309; G02F 1/13458; H01L 24/17; H01L 25/18; H01L 27/124
See application file for complete search history.

(56) References Cited

U.S. PATENT DOCUMENTS

| | | | |
|---|---|---|---|
| 2006/0238450 A1* | 10/2006 | Onodera | G02F 1/1309 345/60 |
| 2007/0030409 A1 | 2/2007 | Aoki | |
| 2009/0174856 A1 | 7/2009 | Aoki | |

FOREIGN PATENT DOCUMENTS

| | | | |
|---|---|---|---|
| JP | 2004-258131 | * | 9/2004 |
| JP | 2007-047259 A | | 2/2007 |
| JP | 2009-224505 A | | 10/2009 |

OTHER PUBLICATIONS

Machine Translation of JP2004-258131.*

* cited by examiner

*Primary Examiner* — Julia Slutsker
(74) *Attorney, Agent, or Firm* — K&L Gates LLP

(57) ABSTRACT

According to an aspect, a display device includes: a substrate including a display region and a non-display region surrounding the display region; at least one driver IC including connecting terminals with a first surface fixed to face the non-display region; first wires supplying a signal to the display region; first bumps connected with the first wires; second wires transferring a signal to and from outside; second bumps connected with the second wires; and inspection wires. The connecting terminals of the driver IC include first connecting terminals overlapping the first or second bumps in plan view, and second connecting terminals not overlapping the first or second bumps in plan view. The inspection wires include a connecting conductor between themselves and at least one of the second connecting terminals. The inspection wires are pulled out to an outside of the driver IC in plan view.

7 Claims, 16 Drawing Sheets

_US 10,153,244 B2_

DISPLAY DEVICE

CROSS-REFERENCE TO RELATED APPLICATIONS

This application claims priority from Japanese Application No. 2016-073038, filed on Mar. 31, 2016, the contents of which are incorporated by reference herein in its entirety.

BACKGROUND

1. Technical Field

The present invention relates to a display device.

2. Description of the Related Art

A display device includes a substrate in which pixels are formed, and a driver integrated circuit (IC) on which a drive circuit is formed. The drive circuit is connected with an external control device through a flexible substrate. There is also an input detection device, or so-called a touch panel, which can detect an external proximity object. A substrate on which a detection electrode of the touch panel is formed also includes a drive circuit that drives the detection electrode, and the drive circuit may be connected with the flexible substrate in some cases.

Japanese Patent Application Laid-open Publication No. 2009-224505 and Japanese Patent Application Laid-open Publication No. 2007-47259 disclose, as a method of connecting the substrate with the flexible substrate, a method of arranging an anisotropic conductive film (ACF) between the substrate and the flexible substrate and connecting the substrate with the flexible substrate by means of crimping using a crimping head.

By the way, the driver IC on which the drive circuit is formed and a connecting electrode of the substrate, called a bump, are connected with each other through a conductive material such as ACF. Detectability of a coupling state between a terminal of the driver IC and the connecting electrode of the substrate can improve reliability of electrical connection of the display device.

For the foregoing reasons, there is a need for a display device that can detect an electrical coupling state between a driver IC and a substrate.

SUMMARY

According to an aspect, a display device includes: a substrate including a display region and a non-display region that is disposed on a periphery of the display region; at least one driver IC including a plurality of connecting terminals, and having a first surface that is fixed to face the non-display region; a plurality of first wires that supply a signal to the display region; a plurality of first bumps electrically connected with the respective first wires; a plurality of second wires that input and output a signal from and to an outside; a plurality of second bumps electrically connected with the respective second wires; and a plurality of inspection wires. The connecting terminals of the at least one driver IC comprise a plurality of first connecting terminals overlapping the respective first bumps or the respective second bumps in plan view, and a plurality of second connecting terminals not overlapping the first bumps or the second bumps in plan view. The inspection wires include a connecting conductor between themselves and at least one of the second connecting terminals. The inspection wires are pulled out to an outside of the at least one driver IC in plan view.

DETAILED DESCRIPTION

Figure 1:
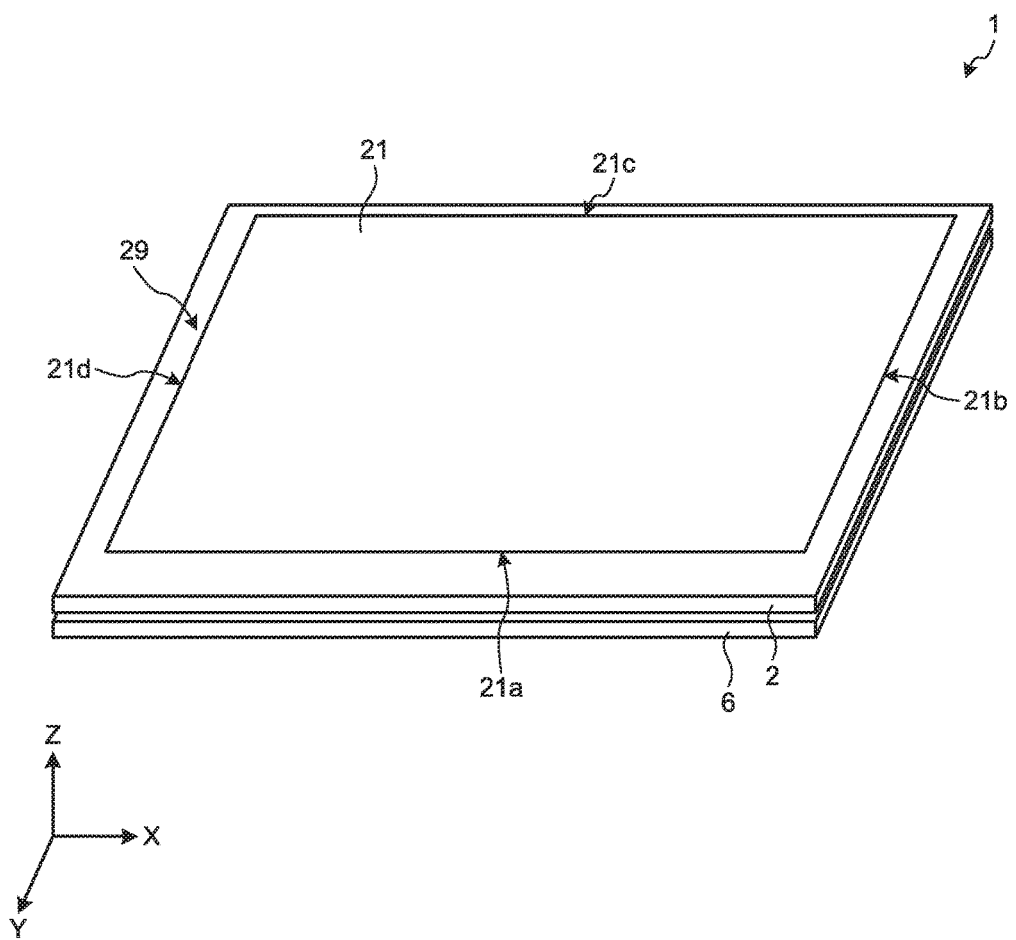
FIG. 1 is an explanatory diagram illustrating an example of a display device according to an embodiment.

Modes (embodiments) for carrying out the present invention will be described below in detail with reference to the drawings. The contents described in the embodiments are not intended to limit the present invention. Components described below include components easily conceivable by those skilled in the art and components substantially identical therewith. Furthermore, the components described below can be appropriately combined. The disclosure is given by way of example only, and various changes made without departing from the spirit of the invention and easily conceivable by those skilled in the art naturally fall within the scope of the invention. The drawings may possibly illustrate the width, the thickness, the shape, and other elements of each unit more schematically than the actual aspect to simplify the explanation. These elements, however, are given by way of example only and are not intended to limit interpretation of the invention. In the specification and the figures, components similar to those previously described with reference to a preceding figure are denoted by like reference numerals, and overlapping explanation thereof will be appropriately omitted.

First Embodiment

Figure 2:
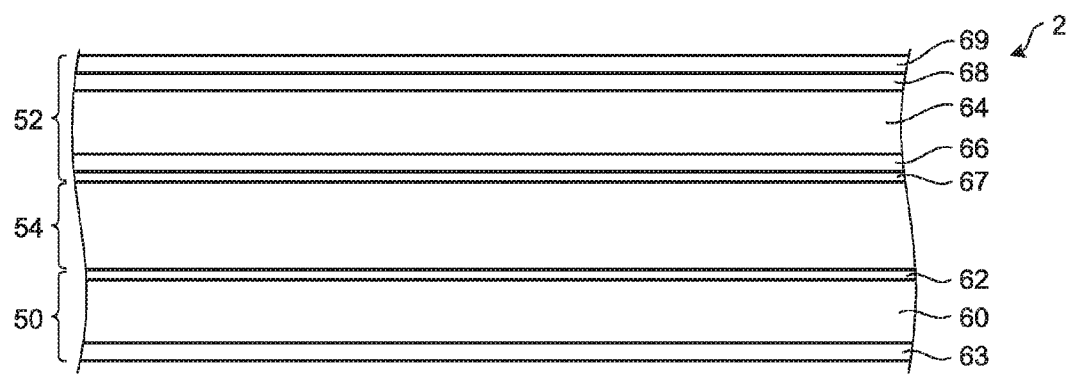
FIG. 2 is a sectional view illustrating an example of a display unit.
Figure 3:
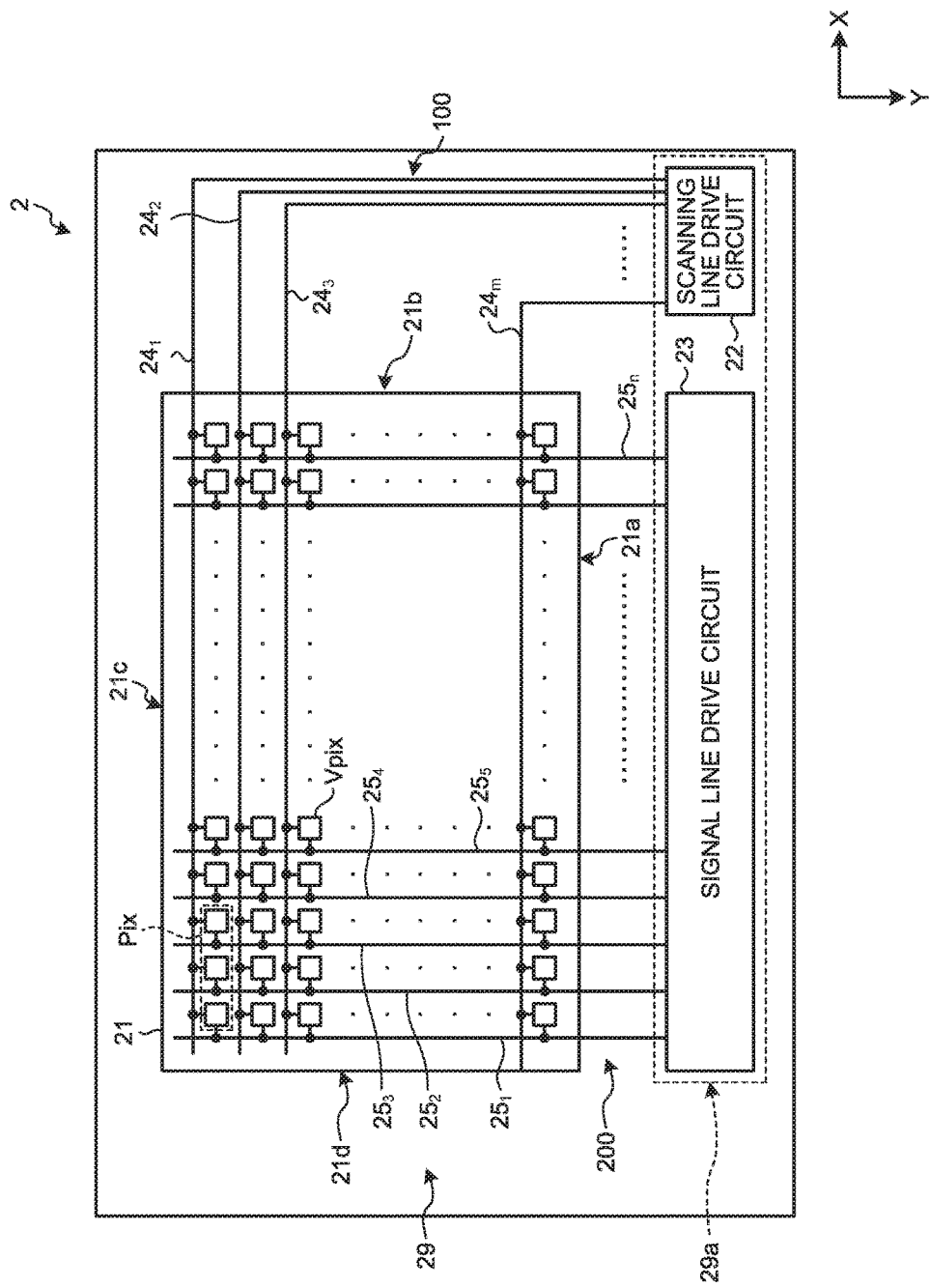
FIG. 3 is a block diagram illustrating the display device of FIG. 1.
Figure 4:
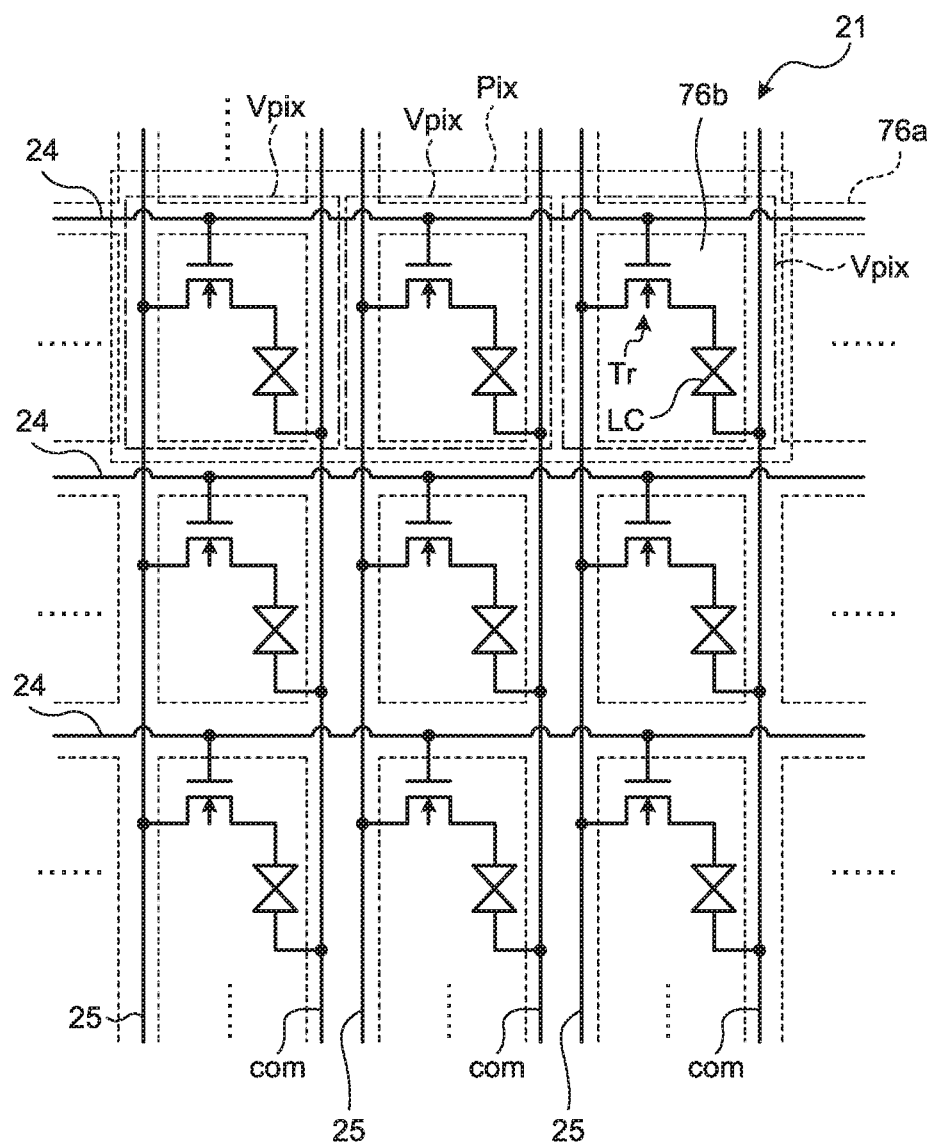
FIG. 4 is a circuit diagram illustrating an example of a pixel circuit.

FIG. 1 is an explanatory diagram illustrating an example of a display device according to the present embodiment, FIG. 2 is a sectional view illustrating an example of the display unit, FIG. 3 is a block diagram illustrating the display device of FIG. 1, and FIG. 4 is a circuit diagram illustrating an example of a pixel circuit. FIG. 1 is schematically illustrated, and the dimensions and shapes are not necessarily the same as the actual dimensions and shapes.

As illustrated in FIG. 1, a display device 1 includes a display unit 2 and a backlight 6. The display device 1 may be a transmissive or transflective display device, or may be a reflective display device not including the backlight 6.

The display unit 2 includes a display region 21 in which an image is displayed and a frame region 29 as a non-display region in which an image cannot be displayed, in plan view. The frame region 29 is provided on the periphery of the display region 21. In the present embodiment, a direction on a plane of the display unit 2 is an X direction, a direction perpendicular to the X direction is a Y direction, and a direction perpendicular to an X-Y plane is a Z direction. The display region 21 has a rectangular shape, and is a region surrounded by a first side 21a, a second side 21b, a third side 21c, and a fourth side 21d.

The backlight 6 is disposed on a back surface side of the display unit 2 (on a surface opposite to a surface where an image is displayed as viewed in the Z direction). The backlight 6 irradiates the display unit 2 with light, and causes the light to enter the entire surface of the display region 21. The backlight 6 includes, for example, a light source and a light-guiding plate that guides the light output from the light source to emit toward the back surface of the display unit 2. The backlight 6 may include a plurality of light sources arranged in the X direction or the Y direction, and the amounts of light of the respective light sources may be independently controlled. Accordingly, the backlight 6 can cause the light to enter a part of the display unit 2 with light emitted from only a part of the light sources. In the display device 1 of the present embodiment, the backlight 6 disposed on the back surface side of the display unit 2 will be described as the light source. However, the light source may be a front light disposed on a front surface side of the display unit 2.

FIG. 2 is a sectional view illustrating an example of the display unit. As illustrated in FIG. 2, the display unit 2 includes a first substrate (upper substrate) 50, a second substrate (lower substrate) 52 disposed to face a surface of the first substrate 50 in a direction perpendicular to the surface of the first substrate 50 (the Z direction illustrated in FIG. 1), and a liquid crystal layer 54 interposed between the first substrate 50 and the second substrate 52. The backlight 6 is disposed on a surface of the first substrate 50, the surface being opposite to a surface thereof on which the liquid crystal layer 54 is disposed.

A large number of liquid crystals are dispersed in the liquid crystal layer 54. The liquid crystals of the liquid crystal layer 54 modulate light passing therethrough according to a state of an electric field, and are liquid crystals that are driven in a transverse electric field mode such as a fringe field switching (FFS) mode or an in-plane switching (IPS) mode. The liquid crystals of the liquid crystal layer 54 may be liquid crystals in other modes such as a twisted nematic (TN) mode, a vertical alignment (VA), and an electrically controlled birefringence (ECB) mode.

The first substrate 50 includes a pixel substrate 60 as a translucent substrate such as glass, a first orientation member 62 laminated on the pixel substrate 60 on the liquid crystal layer 54 side, and a first polarizing plate 63 laminated on the pixel substrate 60 on the opposite side of the liquid crystal layer 54. The pixel substrate 60 will be described below. The first orientation member 62 orientates liquid crystal molecules in the liquid crystal layer 54 in a predetermined direction, and is directly in contact with the liquid crystal layer 54. The first orientation member 62 is made of, for example, a polymeric material such as polyimide, and is formed by the applied polyimide or the like being subjected to rubbing treatment, for example. The first polarizing plate 63 has a function to convert the light entering from the backlight 6 side into linearly polarized light.

The second substrate 52 includes a counter substrate 64 as a translucent substrate such as glass, a color filter 66 formed on the counter substrate 64 on the liquid crystal layer 54 side, a second orientation member 67 formed on the color filter 66 on the liquid crystal layer 54 side, a phase difference plate 68 formed on the counter substrate 64 on the opposite side of the liquid crystal layer 54 side, and a second polarizing plate 69 formed on the phase difference plate 68 on the opposite side of the counter substrate 64 side.

As illustrated in FIG. 3, a large number of pixels Vpix are arranged in the display region 21 in a matrix. A scanning line drive circuit 22 and a signal line drive circuit 23 are arranged in a frame region 29a outside the first side 21a of the display region 21.

As illustrated in FIG. 3, the display region 21 has a structure in which the pixels Vpix including the liquid crystal layer, each of which serves as a unit that constitutes one pixel to be displayed, are arranged in an m row by n column matrix. In this specification, a row refers to a pixel row including m pixels Vpix arrayed in one direction. A column refers to a pixel column including n pixels Vpix arrayed in a direction perpendicular to the direction in which the row is arrayed. Further, values of m and n are determined according to a display resolution in a vertical direction and a display resolution in a horizontal direction.

In the display region 21, scanning lines $24_1$, $24_2$, $24_3$, ... $24_m$ are arranged on a row to row basis, and signal lines $25_1$, $25_2$, $25_3$, $25_4$, $25_5$, ... $25_n$ are arranged on a column to column basis, for the m row by n column array of the pixels Vpix. Hereinafter, in the present embodiment, the scanning lines $24_1$, $24_2$, $24_3$, ... $24_m$ may be collectively described as scanning line 24, and the signal lines $25_1$, $25_2$, $25_3$, ... $25_n$ may be collectively described as signal line 25.

In the display region 21, the scanning line 24 and the signal line 25 are arranged so as to overlap a black matrix 76a in the same layer as the color filter 66 (see FIG. 2) in plan view (Z direction). In the display region 21, a region where the black matrix 76a is not arranged is an opening portion 76b.

The color filter 66 illustrated in FIG. 2 includes color regions colored into three colors of red (R), green (G), and blue (B), for example. In the color filter 66, the color regions colored into the three colors of red (R), green (G), and blue (B) are periodically arrayed in the opening portions 76b illustrated in FIG. 4, and a pixel Pix corresponds to a set of the color regions having the respective three colors of R, G, and B corresponding to the respective pixels Vpix. Therefore, the pixel Vpix is also called a sub-pixel. The color filter 66 faces the liquid crystal layer 54 in a direction perpendicular to the pixel substrate 60. Any combination of colors may be employed as long as the color filter 66 is colored into different colors. The color filter 66 may be formed so that the black matrix 76a covers an outer periphery of the pixels Vpix illustrated in FIG. 3. This black matrix 76a is disposed on the boundary of the pixels Vpix, which are two-dimensionally arranged, thereby forming a lattice shape. Further, the black matrix 76a is formed of a material having a higher optical absorption rate than that of the color filter 66.

As illustrated in FIG. 2, the second orientation member 67 orientates the liquid crystal molecules in the liquid crystal layer 54 in a predetermined direction, and is directly in contact with the liquid crystal layer 54, similarly to the first orientation member 62. The second orientation member 67 is made of, for example, a polymeric material such as polyimide, and is formed by the applied polyimide or the like being subjected to rubbing treatment, for example. The phase difference plate 68 has a function to compensate changes in view angle caused by the first polarizing plate 63 and the second polarizing plate 69. The second polarizing plate 69 has a function to absorb a linearly polarized light component parallel to a polarizing plate absorption axis, and transmit a polarization component perpendicular to the polarizing plate absorption axis. The second polarizing plate 69 has a function to transmit/block the light, depending on an ON/OFF state of the liquid crystals.

The scanning line drive circuit 22 illustrated in FIG. 4 outputs digital data of one line supplied from the outside as a scanning signal in sequence, and sequentially scans the pixels Vpix row by row by providing the scanning signal to each of the scanning lines $24_1$, $24_2$, $24_3$, ... $24_m$ of the display region 21. The scanning line drive circuit 22 outputs the digital data in sequence from a vertical scanning upper direction to a vertical scanning lower direction, i.e., from the scanning line $24_1$ to the scanning line $24_m$ (in the Y direction). The scanning line drive circuit 22 may output the digital data in sequence from the vertical scanning lower direction to the vertical scanning upper direction.

R (red), G (green), or B (blue) 6-bit digital video data is provided to the signal line drive circuit 23, for example. The signal line drive circuit 23 writes display data through the signal line 25 to the pixels Vpix of a row vertically scanned by the scanning line drive circuit 22, on a pixel to pixel basis, on a sub-pixels to sub-pixels basis, or to the sub-pixels all together.

A large number of pixel circuits including active elements (for example, thin film transistors) are arranged on the pixel substrate 60 illustrated in FIG. 2 in a matrix in plan view. Wires such as the signal line 25 and the scanning line 24 are formed in the display region 21. The signal line 25 supplies a pixel signal as display data to thin film transistors (TFTs) Tr of the pixels Vpix illustrated in FIG. 4, and the scanning line 24 drives the thin film transistors Tr. In this way, the signal line 25 extend on a plane parallel to the surface of the pixel substrate 60, and supplies the pixel signal for displaying an image to the pixels Vpix. The pixel Vpix includes the thin film transistor Tr and a liquid crystal capacitance LC. In this example, the thin film transistor Tr is configured by a n-channel metal oxide semiconductor (MOS)-type TFT. One of the source and the drain of the thin film transistor Tr is connected with the signal line 25, the gate thereof is connected with the scanning line 24, and the other of the source and the drain is connected with one end of the liquid crystal capacitance LC. One end of the liquid crystal capacitance LC is connected with the thin film transistor Tr, and the other end thereof is connected with a common potential of a common electrode com. In this way, the common potential commonly provided to the pixels is provided to a pixel electrode of each pixel Vpix in the display region 21.

The pixel Vpix is connected with other pixels Vpix belonging to the same row of the display region 21 through the scanning line 24. The scanning lines 24 extend along the pixels Pix or the row in which the pixels Vpix are arrayed. The scanning lines are connected with the scanning line drive circuit 22. The scanning lines 24 are supplied with the scanning signals from the scanning line drive circuit 22. The pixel Vpix is connected with other pixels Vpix belong to the same column of the display region 21 through the signal line 25. The signal lines 25 are connected with the signal line drive circuit 23, and are supplied with the pixel signals from the signal line drive circuit 23. The common potential of the common electrode com is connected with a drive electrode driver (not illustrated), and is supplied a voltage from the drive electrode driver. Further, the pixel Vpix is connected with other pixels Vpix belonging to the same column of the display region 21 through the common potential of the common electrode com.

Figure 5:
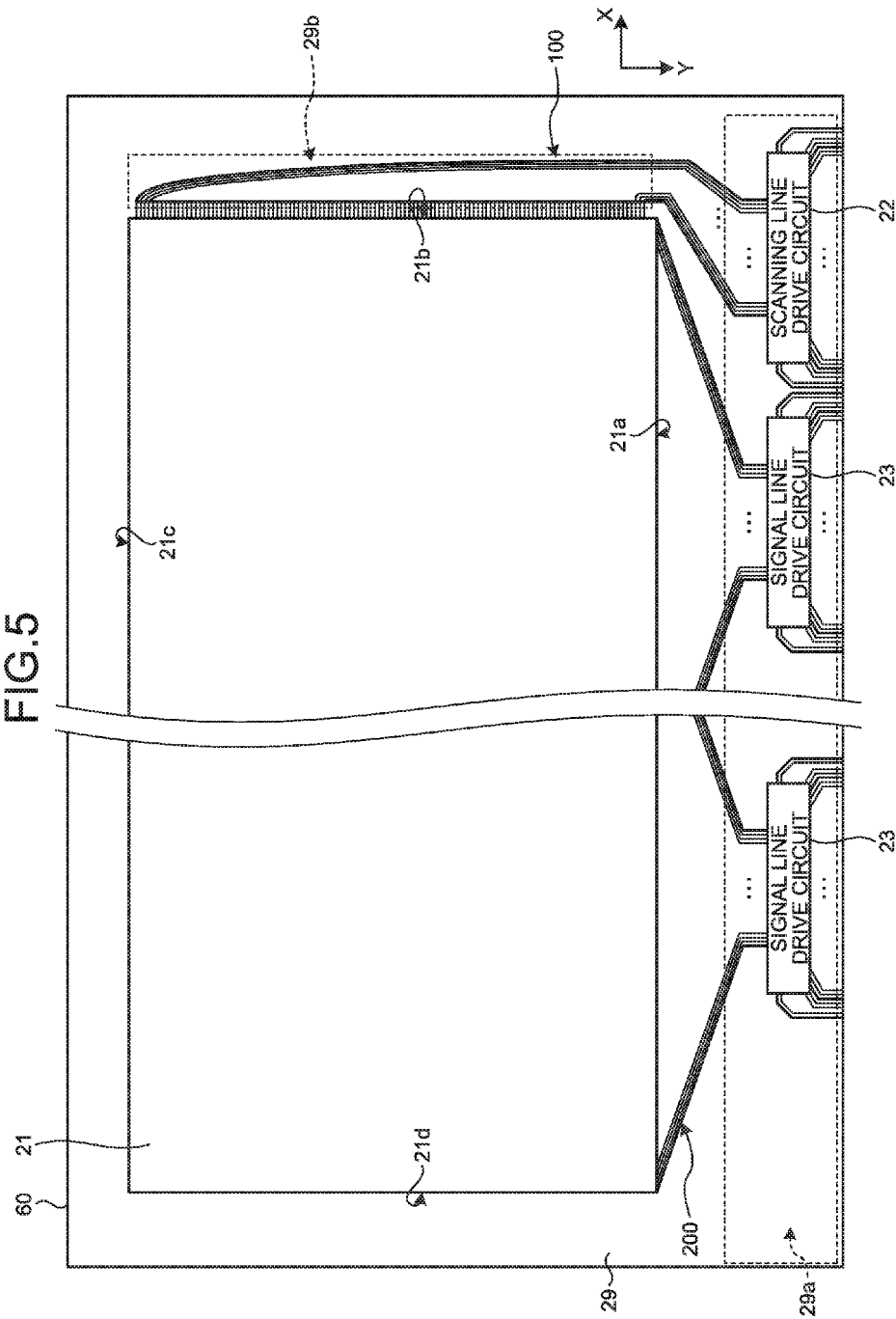
FIG. 5 is a plan view schematically illustrating a plurality of wires electrically connecting a scanning line drive circuit with scanning lines.

FIG. 5 is a plan view schematically illustrating a plurality of wires electrically connecting a scanning line drive circuit with scanning lines. Each of the scanning line drive circuit 22 and the signal line drive circuit 23 is an integrated circuit called a chip on glass (COG), and is referred to as a driver IC. In the present embodiment, a plurality of the signal line drive circuits 23 are provided, but one driver IC may be provided. In the present embodiment, the scanning line drive circuit 22 and the signal line drive circuit 23 are provided as individual driver ICs, but may be provided as a single driver IC. Alternatively, the scanning line drive circuit 22 and the signal line drive circuit 23 together with the above-described drive electrode driver may be provided as a single driver IC.

The scanning line drive circuit 22 applies the scanning signals to the gates of the thin film transistors Tr of the pixels Vpix through a plurality of wires 100 illustrated in FIGS. 3 and 5 and the scanning lines 24 (scanning lines $24_k$, $24_2$, $24_3$, ... $24_m$) illustrated in FIG. 3. Accordingly, one row (one horizontal line) of the pixels Vpix of the display region 21 is sequentially selected as an object to be driven and displayed.

The signal line drive circuit 23 supplies the pixel signals to the pixels Vpix of the one horizontal line sequentially selected by the scanning line drive circuit 22, through a plurality of wires 200 illustrated in FIGS. 3 and 5 and the signal lines 25 (signal lines $25_k$, $25_2$, $25_3$, $25_4$, $25_5$, ... $25_n$) illustrated in FIG. 3. Then, in these pixels Vpix, display of one horizontal line is performed according to the supplied pixel signals.

As illustrated in FIG. 5, the wires 200 are arranged in the frame region 29a outside the first side 21a of the display region 21. The wires 200 electrically connect the signal line drive circuit 23 with the signal lines 25 illustrated in FIG. 3. The wires 200 are a conductive pattern formed of an aluminum (Al) or an aluminum alloy conductor. Alternatively, the wires 200 may be a conductive pattern formed of a conductor in which two types or more of conductive metals, such as aluminum (Al), titanium (Ti), and molybdenum (Mo), are laminated.

The number of the wires 200 is the same as the number of the signal lines 25. The number of the signal lines 25 is increased as a resolution of the display region 21 is increased. Therefore, the number of the wires 200 is also increased as the resolution of the display region 21 is increased. The present embodiment employs a configuration in which three signal line drive circuits 23 are provided. Therefore, one side of one signal line drive circuit 23 is made not too long compared with the other side thereof.

As illustrated in FIG. 5, the wires 100 are arranged in the frame region 29b outside the second side 21b of the display region 21, the second side 21b being perpendicular to the first side 21a of the display region 21. The wires 100 electrically connect the scanning line drive circuit 22 with the respective scanning lines 24. The wires 100 are a conductive pattern formed of an aluminum (Al) or an aluminum alloy conductor, for example. Alternatively, the wires 100 may be a conductive pattern formed of a conductor in which two types or more of conductive metals, such as aluminum (Al), titanium (Ti), and molybdenum (Mo), are laminated.

The number of the wires 100 is the same as the number of the scanning lines 24. The number of the scanning lines 24 is increased as the resolution of the display region 21 is increased. Therefore, the number of the wires 100 is also increased as the resolution of the display region 21 is increased. Therefore, the width in the X direction of the wires 100 arranged in the limited frame region 29b becomes smaller as the resolution of the display region 21 is increased.

Figure 6:
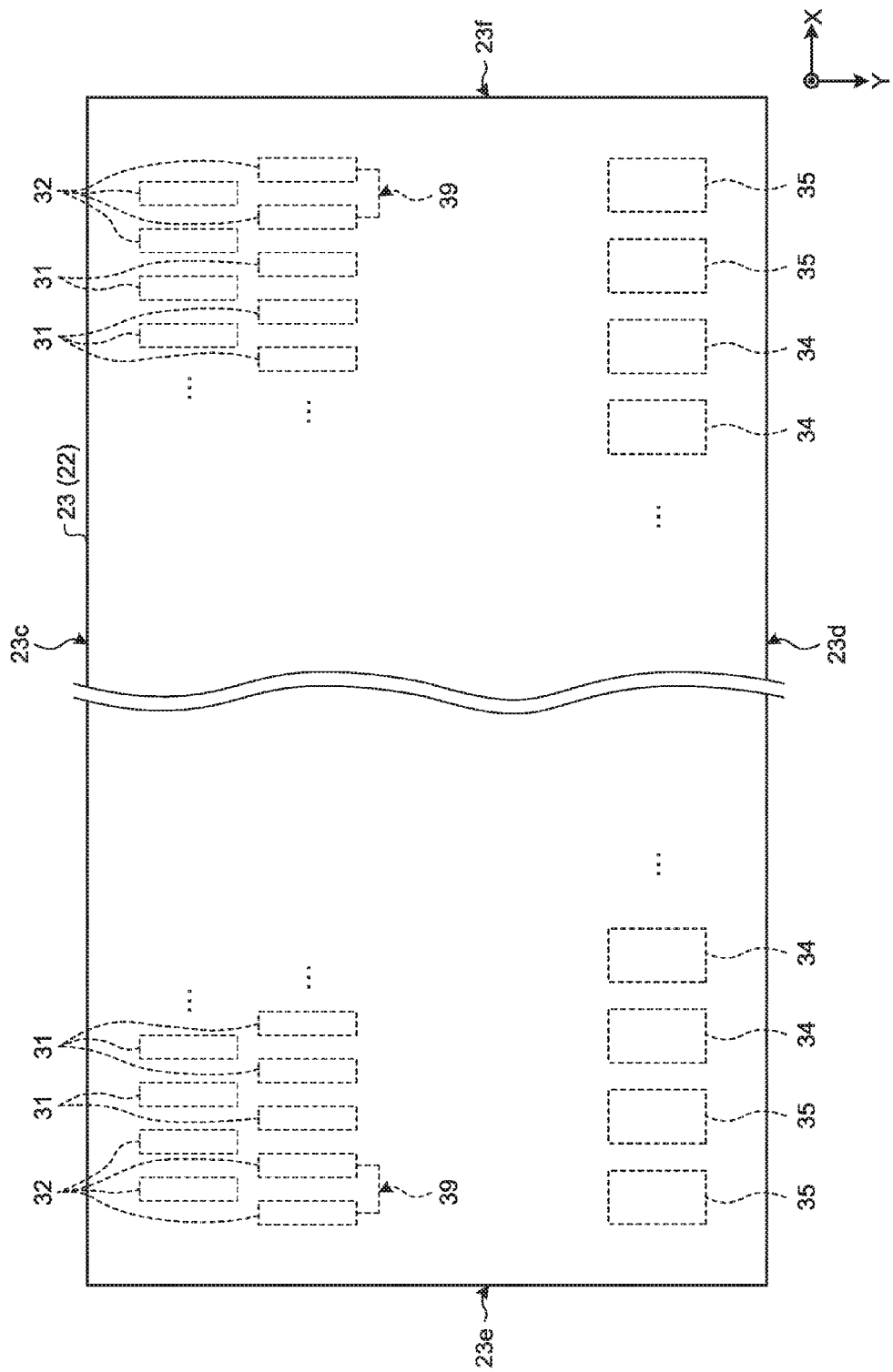
FIG. 6 is a plan view schematically illustrating terminals of a driver IC.
Figure 7:
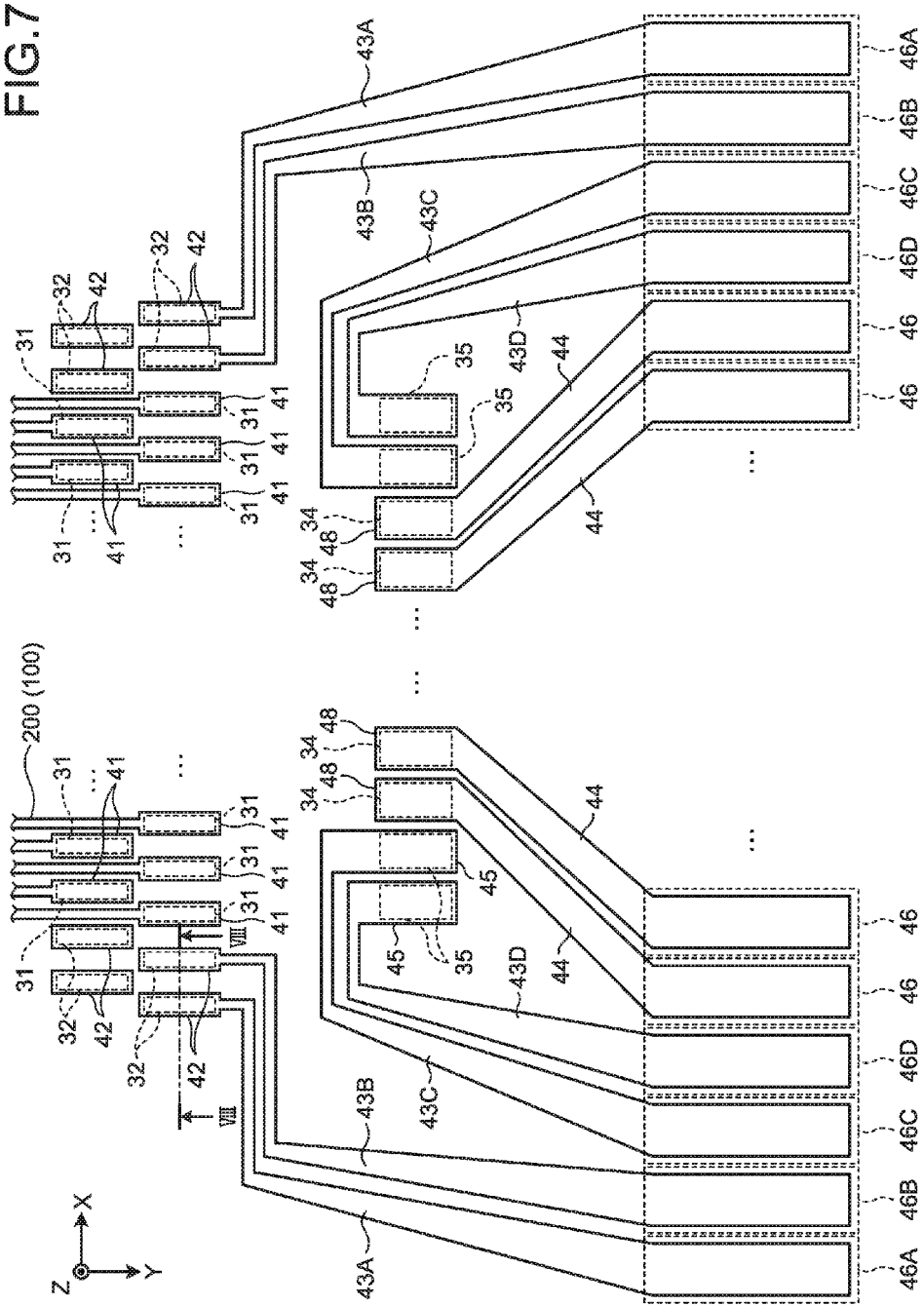
FIG. 7 is an enlarged schematic view illustrating connecting electrodes and wires of a substrate on which the terminals of the driver IC according to the first embodiment are mounted.
Figure 8:
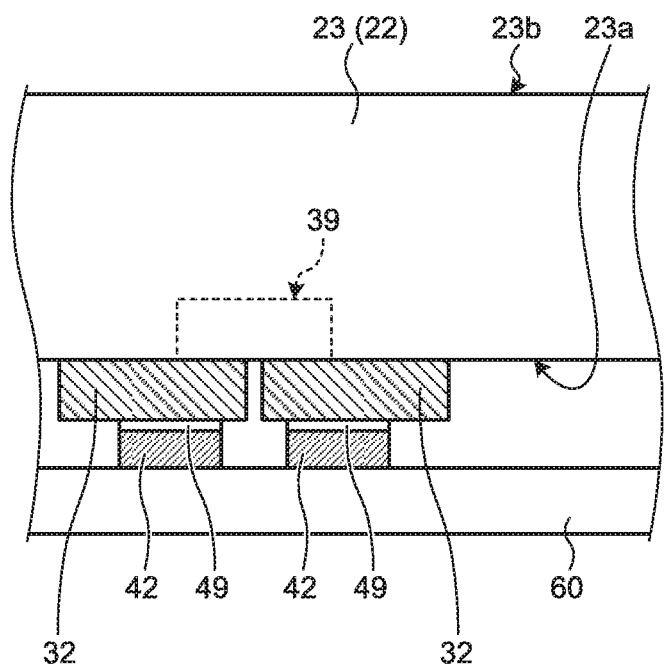
FIG. 8 is a schematic view illustrating a cross section taken along line VIII-VIII in FIG. 7.
Figure 9A:
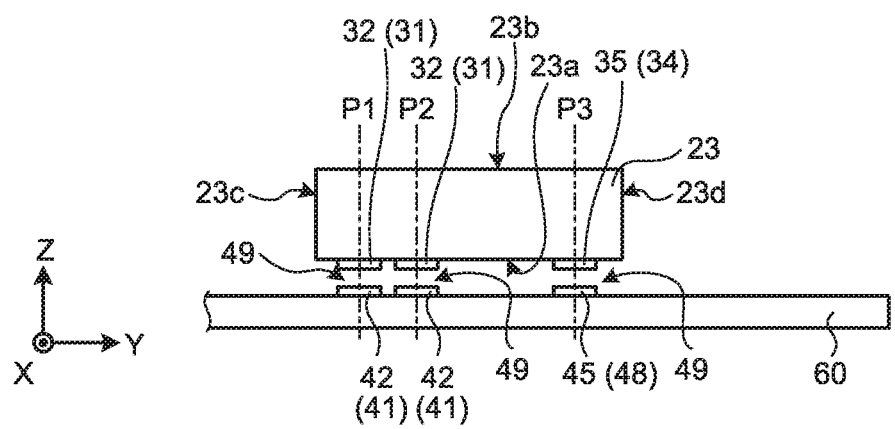
FIGS. 9A and 9B are schematic views for each describing a positional relationship between the terminals of the driver IC and the connecting electrodes of the substrate.
Figure 9B:
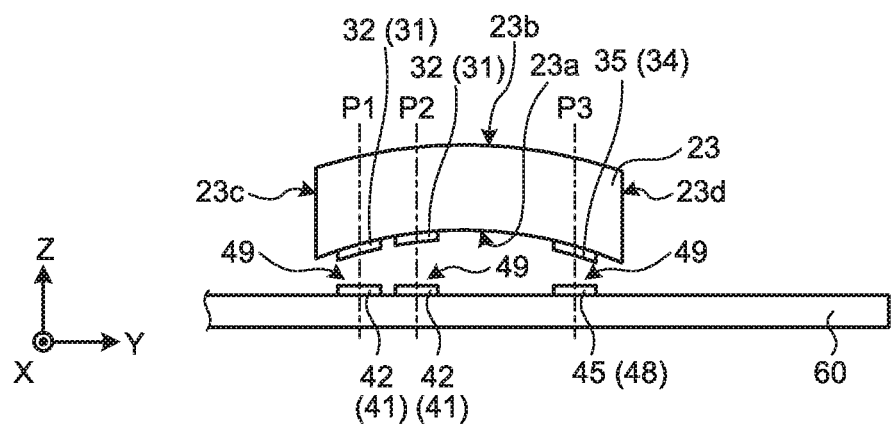

FIG. 6 is a plan view schematically illustrating terminals of a driver IC. FIG. 7 is an enlarged schematic view illustrating connecting electrodes and wires of a substrate on which the terminals of the driver IC according to the first embodiment are mounted. FIG. 8 is a schematic view illustrating a cross section taken along line VIII-VIII in FIG. 7. FIGS. 9A and 9B are schematic views for each describing a positional relationship between the terminals of the driver IC and the connecting electrodes of the substrate. FIGS. 9A and 9B are schematic views of the terminals of the driver IC and the connecting electrodes of the substrate as viewed from a side surface. As illustrated in FIGS. 6 and 9A and 9B, the driver IC of the signal line drive circuit 23 is a cube having a first surface 23a, a second surface 23b, a third surface 23c, a fourth surface 23d, a fifth surface 23e, and a sixth surface 23f. The first surface 23a faces the second surface 23b. The third surface 23c faces the fourth surface 23d. The fifth surface 23e faces the sixth surface 23f. The driver IC illustrated in FIG. 9A has a normal shape. In contrast, the driver IC illustrated in FIG. 9B has a curve such that a central portion in the Y direction of the first surface 23a is recessed.

As illustrated in FIG. 8, a connecting terminal 32 is electrically connected with a third bump 42 through a connecting conductor 49. Since the connecting terminals 32 are short-circuited in internal wires 39, the third bumps 42 are also short-circuited through the connecting terminal 32, the internal wires 39, and the connecting terminal 32.

A plurality of connecting terminals 31, 32, 34, and 35 illustrated in FIG. 6 are exposed on the first surface 23a illustrated in FIG. 9A. In this way, the signal line drive circuit 23 is a driver IC of a face-down method that causes the first surface 23a to face the pixel substrate 60.

As illustrated in FIG. 6, the connecting terminals 31 and 32 are arranged to form a plurality of columns as viewed in the X direction that is a longitudinal direction of the driver IC in plan view. The connecting terminals 32, the connecting terminals 31, and the connecting terminals 32 are sequentially arranged in the X direction in plan view. The connecting terminals 32 are positioned closer to the fifth surface 23e or the sixth surface 23f on a short side of the driver IC than the connecting terminals 31 are positioned, in the X direction in plan view.

Similarly, the connecting terminals 35 and 34 are arranged to form columns as viewed in the X direction that is the longitudinal direction of the driver IC in plan view. The connecting terminals 35, the connecting terminals 34, and the connecting terminals 35 are sequentially arranged in the X direction in plan view. The connecting terminals 35 are positioned closer to the fifth surface 23e or the sixth surface 23f on the short side of the driver IC than the connecting terminals 34 are positioned, in the X direction in plan view.

The signal line drive circuit 23 of the first embodiment includes the internal wires 39 that short-circuit the connecting terminals 32 adjacent to each other inside the driver IC. The internal wires 39 may not be provided depending on a driver IC, as described in a second embodiment.

As illustrated in FIG. 7, a first bump 41, a second bump 48, a third bump 42, a fourth bump 45, a wire 44, inspection wires 43A, 43B, 43C, and 43D, an input/output bump 46, and inspection bumps 46A, 46B, 46C, and 46D are arranged on the pixel substrate 60, in addition to the wires 200.

The first bumps 41 are electrically connected with the respective wires 200. The input/output bump 46 is a connecting terminal that is joined with a connecting terminal of a flexible substrate (not illustrated). The wire 44 is a wire that connects the second bump 48 with the input/output bump 46. The wires 44 are wires that extend toward an inside of the pixel substrate 60 from the respective input/output bumps 46, and that transmit input/output signals between the driver IC and an external device. In this way, the second bumps 48 are electrically connected with the respective wires 44.

Typically, the number of the wires 200 is larger than the number of the wires 44. The first bumps 41 are arranged in a plurality of columns in a staggered manner, in the X direction in plan view. Therefore, the area of the first bumps 41 is smaller than the area of the second bumps 48.

The third bumps 42 are dummy bumps not electrically connected with the respective wires 200. Similarly, the fourth bumps 45 are dummy bumps not electrically connected with the respective wires 44.

The inspection bumps 46A, 46B, 46C, and 46D are connecting terminals for allowing electrical connection of inspection probes (not illustrated).

The inspection wires 43A and 43B are wires that electrically connect the inspection bumps 46A and 46B with the respective third bumps 42. In the first embodiment, the third bumps 42 are portions wider than the inspection wires 43A and 43B. However, parts of the inspection wires 43A and 43B may serve as the third bumps 42 without wider portions.

The inspection wires 43C and 43D are wires that electrically connect the inspection bumps 46C and 46D with the respective fourth bumps 45. In the first embodiment, parts of the inspection wires 43C and 43D serve as the fourth bumps 45. However, portions wider than the inspection wires 43C and 43D may be provided to serve as the fourth bumps 45.

The inspection wires 43A, 43B, 43C, and 43D are pulled out toward the outside of the driver IC of the signal line drive circuit 23 in plan view, as illustrated in FIG. 5. As illustrated in FIG. 7, one driver IC is connected with eight inspection wires 43A, 43A, 43B, 43B, 43C, 43C, 43D, and 43D, and thus the eight inspection wires 43A, 43A, 43B, 43B, 43C, 43C, 43D, and 43D are pulled out toward the outside of the one driver IC.

As illustrated in FIG. 7, the connecting terminal 31 of the IC driver overlaps the first bump 41 in plan view. The connecting terminal 34 of the IC driver overlaps the second bump 48 in plan view. The connecting terminal 32 of the IC driver does not overlap the first bump 41 or the second bump 48 in plan view. The connecting terminal 32 of the IC driver overlaps the third bump 42 in plan view. The connecting terminal 35 of the IC driver does not overlap the first bump 41 or the second bump 48 in plan view. The connecting terminal 35 of the IC driver overlaps the fourth bump 45 in plan view.

Connecting conductors 49 (see FIG. 9A) of the ACF on the substrate are provided between the connecting terminals 31, 32, 34, and 35 of the driver IC, and the first bump 41, the second bump 48, the third bump 42, and the fourth bump 45, which respectively overlap the connecting terminals 31, 32, 34, and 35 in plan view. The driver IC itself is pressed and crimped by a crimping head.

The ACF includes conductive particles, and an insulating adhesive containing the conductive particle. When the driver IC itself is pressed and crimped by the crimping head, the adhesive is cured in a state where the conductive particles are bonded together, between the connecting terminals 31, 34, 32, and 35 of the driver IC, and the first bump 41, the second bump 48, the third bump 42, and fourth bump 45, which respectively overlap the connecting terminals 31, 34, 32, and 35 in plan view, thereby maintaining the electrical connection.

In the driver IC of the face-down method, it has been desired to confirm that conductive particles are sufficiently pressurized and bonded together, and the electrical connection is established between the connecting terminals 31 and 34 of the driver IC, and the first bump 41 and the second bump 48, which respectively overlap the connecting terminals 31 and 34 in plan view. Therefore, in the first embodiment, respective electrical coupling states between parts of the connecting terminals 32 and 35, which are not used and are close to four corners of the driver IC of the face-down method, and the third bumps 42 and the fourth bumps 45 as dummy bumps, are detected.

As an inspection method of the first embodiment, firstly, the inspection bumps 46A and 46B are electrically connected with respective inspection probes (not illustrated). A small current flows from the inspection probe to the inspection bump 46A. This small current is conducted through a path of the inspection wire 43A, the third bump 42, the connecting conductor 49, the connecting terminal 32 of the driver IC, the internal wires 39, the connecting terminal 32 of the driver IC, the connecting conductor 49, the third bump 42, and the inspection wire 43B. Then, the small current or the voltage thereof is detected by the inspection probe connected with the inspection bump 46B. A small current may flow from the inspection probe to the inspection bump 46B, and the small current that is conducted through a reverse path to the above-described path or the voltage thereof may be detected by the inspection probe connected with the inspection bump 46A.

Similarly, the inspection bumps 46C and 46D are electrically connected with respective inspection probes (not illustrated). A small current flows from the inspection probe to the inspection bump 46C. This small current is conducted through a path of the inspection wire 43C, the fourth bump 45, the connecting conductor 49, the connecting terminal 32 of the driver IC, the internal wires 39, the connecting terminal 32 of the driver IC, the connecting conductor 49, the fourth bump 45, and the inspection wire 43D. Then, the small current or the voltage thereof is detected by the inspection probe connected with the inspection bump 46D. The small current may flow from the inspection probe to the inspection bump 46D, and the small current that is conducted through a reverse path to the above-described path or the voltage thereof may be detected by the inspection probe connected with the inspection bump 46C.

According to the above-described inspection, the respective electrical coupling states between the connecting terminals 32 and 35, which are not used and are close to the four corners of the driver IC of the face-down method, and the third bumps 42 and the fourth bumps 45 as dummy bumps, can be detected. As a result, the pressure contact state of the four corners of the driver IC can be grasped, and thus, even if a driver IC having a different shape is used, the pressure contact state can be grasped. As a result, the number of the signal lines 25 handled by one driver IC can be increased. Therefore, increase in the number of the driver ICs can be prevented even if the resolution of the display region 21 is increased.

In the above description, the electrical connection between the driver IC of the signal line drive circuit 23 and the pixel substrate 60 has been described. The above-described connecting configuration can be employed for the electrical connection between the driver IC of the scanning line drive circuit 22, and the pixel substrate 60. The driver IC of the signal line drive circuit 23, and the driver IC of the scanning line drive circuit 22 have a similar configuration regarding the electrical connection between the driver IC and the pixel substrate 60. The electrical coupling state between the driver IC and the substrate can be detected before and after a reliability test, and thus this connecting configuration can contribute to quality improvement. Even if the scanning line drive circuit 22 and the signal line drive circuit 23 are configured as a single driver IC, the above-described connecting configuration can be employed regarding the electrical connection between the driver IC and the pixel substrate 60.

As illustrated in FIG. 7, the first bumps 41 and the third bumps 42 are arranged to form a plurality of columns in the X direction in plan view. The third bumps 42, the first bumps 41, and the third bumps 42 are sequentially arranged in the X direction in plan view.

Similarly, the second bumps 48 and the fourth bumps 45 are arranged to form columns in the X direction in plan view. The fourth bumps 45, the second bumps 48, and the fourth bumps 45 are sequentially arranged in the X direction in plan view.

By the way, as illustrated in FIG. 6, positions in the Y direction of the connecting terminals 31, 32, 34, and 35 of the first surface 23a are close to either the third surface 23c or the fourth surface 23d. A curve may appear such that a central portion in the Y direction of the first surface 23a is recessed, as illustrated in FIG. 9B, due to an influence of coarse-dense distribution of the connecting terminals 31, 32, 34, and 35. Therefore, as illustrated in FIG. 9B, when a comparison is made among a position P1 of a first bump column (a column of the first bump 41 and the third bump 42), a position P2 of a second bump column (a column of the first bump 41 and the third bump 42), and a position P3 of a third bump column (a column of the second bump 48 and the fourth bump 45), from the third surface 23c to the fourth surface 23d in the Y direction, a gap between the third bump 42 and the connecting terminal 32 tends to be wider at the position P2.

The inspection wires 43A and 43B are connected with the respective third bumps 42 at the position P2 of the second bump column (the column of the first bump 41 and the third bump 42) that are provided inside, as viewed in the Y direction. That is, the connecting terminals 32 that overlap the inspection wires 43A and 43B in plan view are arranged at the position P2 of the second bump column that are provided inside in a short direction of the driver IC. If the conductive particles are sufficiently pressurized and bonded together and the electrical connection is established between the third bumps 42 and the connecting terminals 32 at the position P2, it can be assumed that the conductive particles are sufficiently pressurized and bonded together and the electrical coupling is established between the first bump 41 and the connecting terminal 31 at the position P2.

Second Embodiment

Figure 10:
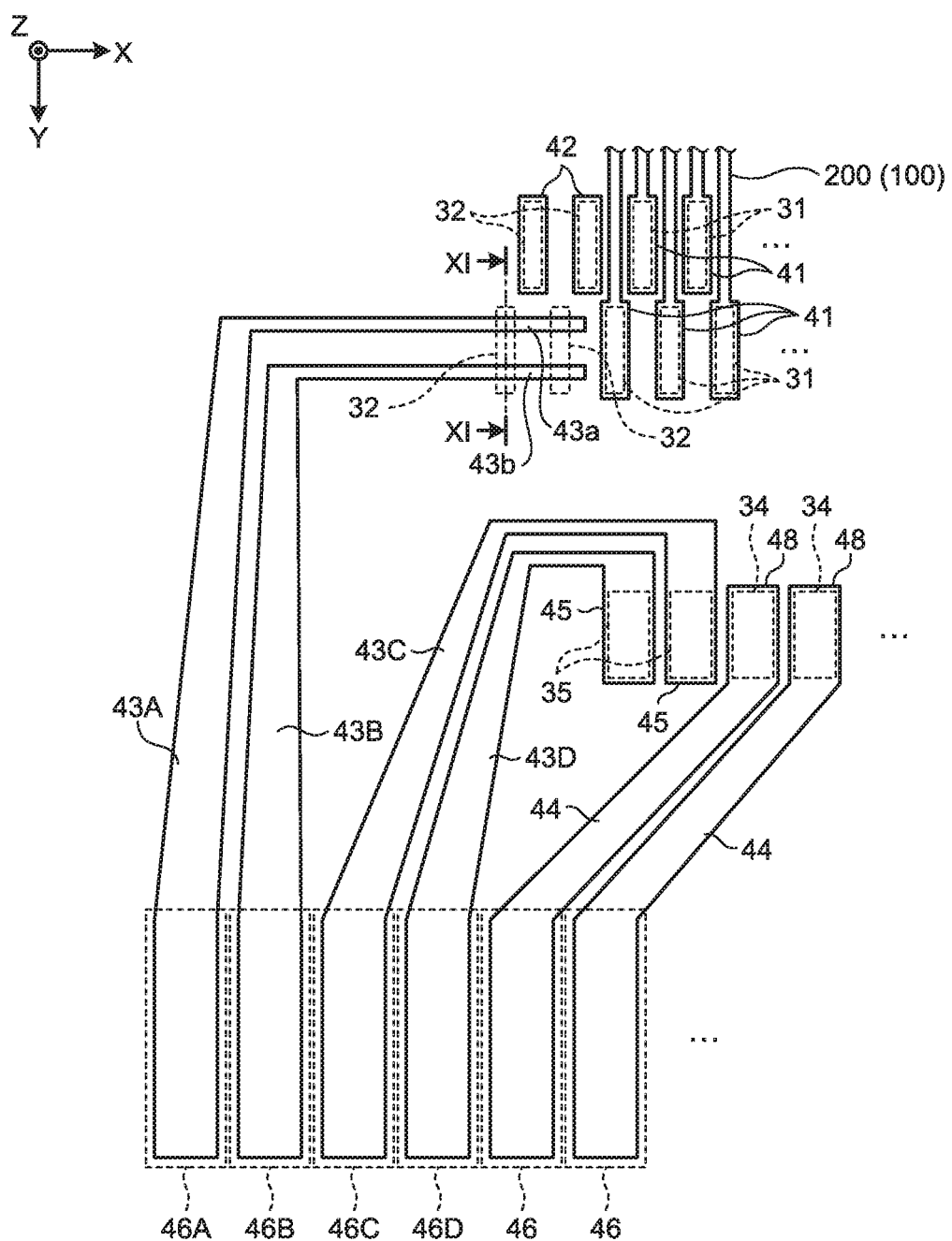
FIG. 10 is an enlarged schematic view illustrating connecting electrodes and wires of a substrate on which terminals of a driver IC according to a second embodiment are mounted.
Figure 11:
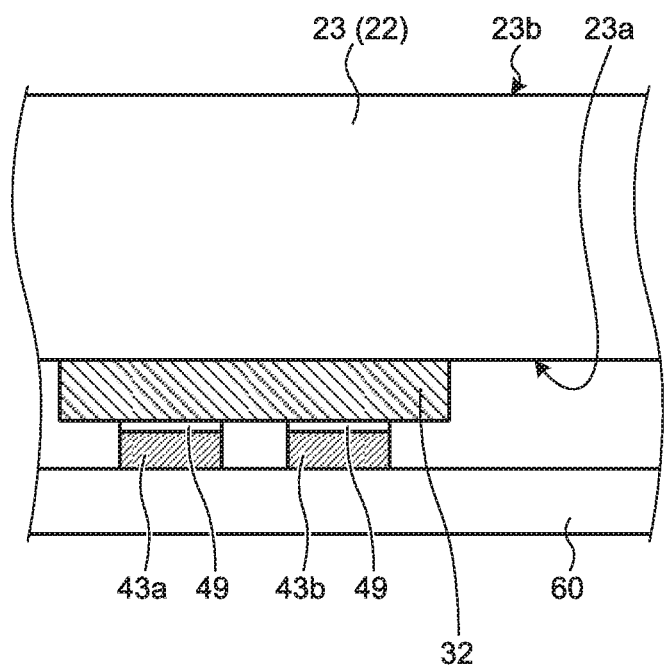
FIG. 11 is a schematic view illustrating a cross section taken along line XI-XI in FIG. 10.

FIG. 10 is an enlarged schematic view illustrating connecting electrodes and wires of a substrate on which terminals of a driver IC according to a second embodiment are mounted. FIG. 11 is a schematic view illustrating a cross section taken along line XI-XI in FIG. 10. The same configuration elements as those described in the first embodiment are denoted with the same reference signs, and overlapping description is omitted.

The arrangement illustrated in FIG. 10 can be mirror-inverted with respect to a Y direction, like FIG. 7, and thus only the left side is described. Therefore, two connecting terminals 32, a plurality of connecting terminals 31, and two connecting terminals 32 are sequentially arranged in an X direction in plan view.

A driver IC of the second embodiment does not include internal wires 39, which are provided inside the driver IC of the signal line drive circuit 23 illustrated in FIG. 6. Therefore, even if two inspection wires 43A and 43B overlap respective connecting terminals 32 adjacent to each other in plan view, the two inspection wires 43A and 43B cannot conduct each other, like the first embodiment. Therefore, it is necessary to devise a method of routing the inspection wires 43A and 43B.

As illustrated in FIG. 10, end portions of the inspection wires 43A and 43B are third bumps 43a and 43b, respectively. Then, both the third bumps 43a and 43b overlap the connecting terminals 32 and 32 adjacent to each other in plan view. As a result, the third bump 43a and the third bump 43b are short-circuited through the connecting terminals 32 if the electrical connection between the third bumps 43a and 43b, and the connecting terminals 32 is established through connecting conductors 49, as illustrated in FIG. 11.

As an inspection method of the second embodiment, firstly, inspection bumps 46A and 46B are electrically connected with respective inspection probes (not illustrated). A small current flows from the inspection probe to the inspection bump 46A. This small current is conducted through a path of an inspection wire 43A, the third bump 43a, the connecting conductor 49, the connecting terminal 32 of the driver IC, the connecting conductor 49, the third bump 43b, and an inspection wire 43B. Then, the small current or the voltage of the small current is detected by the inspection probe connected with the inspection bump 46B. A small current may flow from the inspection probe to the inspection bump 46B, and the small current that is conducted through a reverse path to the above-described path or the voltage thereof may be detected by the inspection probe connected with the inspection bump 46A.

First Modification of Second Embodiment

Figure 12:
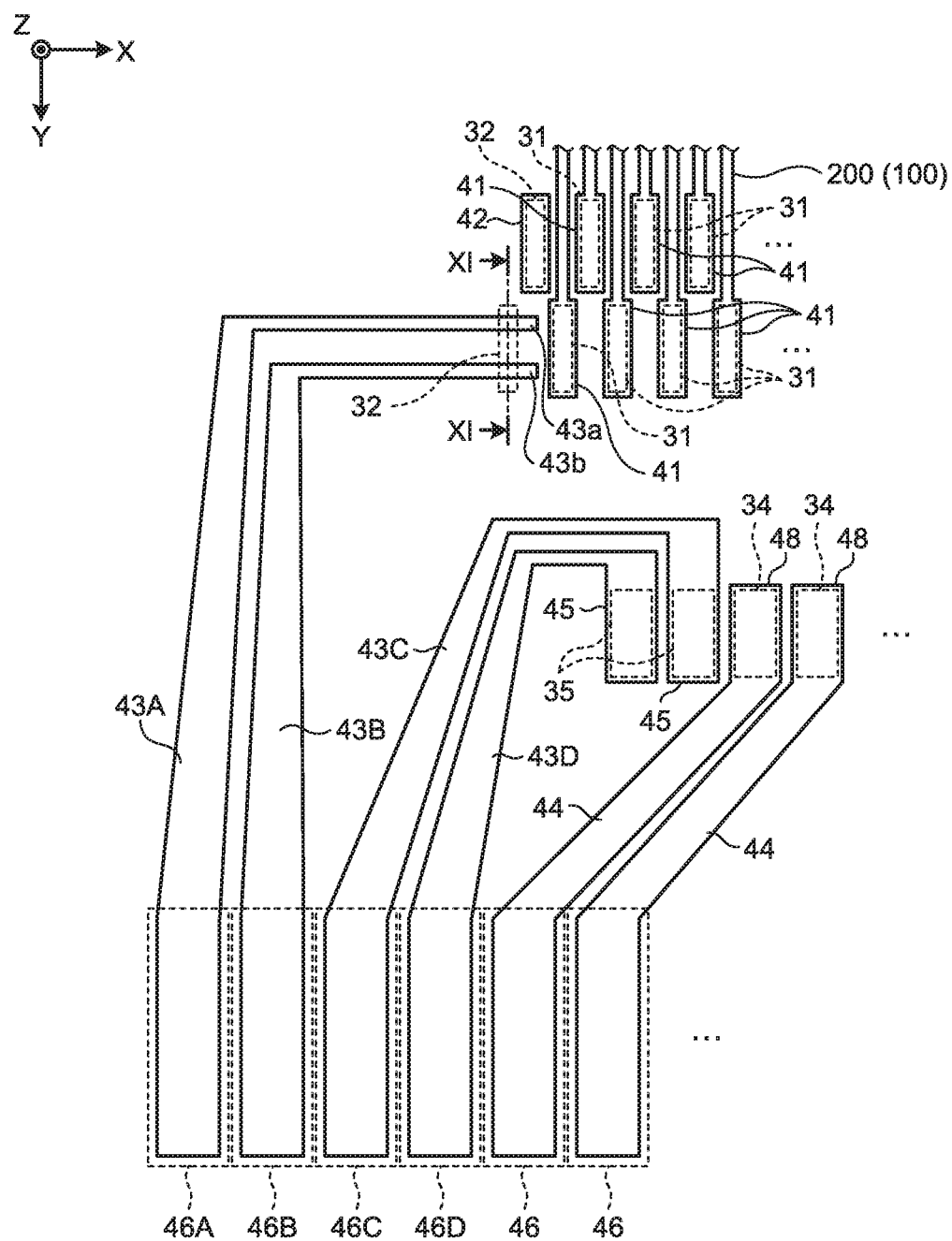
FIG. 12 is an enlarged schematic view illustrating connecting electrodes and wires of a substrate on which terminals of a driver IC according to a first modification of the second embodiment are mounted.

FIG. 12 is an enlarged schematic view illustrating connecting electrodes and wires of a substrate on which terminals of a driver IC according to a first modification of the second embodiment are mounted. The same configuration elements as those described in the first embodiment and the second embodiment are denoted with the same reference signs, and overlapping description is omitted.

The arrangement illustrated in FIG. 12 can be mirror-inverted with respect to a Y direction, like FIG. 7, and thus only the left side is described. Therefore, one connecting terminal 32, a plurality of connecting terminals 31, and one connecting terminal 32 are sequentially arranged in an X direction in plan view.

As illustrated in FIG. 12, end portions of inspection wires 43A and 43B are third bumps 43a and 43b. Then, both the third bumps 43a and 43b overlap one connecting terminal 32 in plan view. As a result, the third bumps 43a and 43b are short-circuited through the connecting terminal 32 if the electrical connection between the third bumps 43a and 43b, and the connecting terminal 32 is established through a connecting conductor 49, as illustrated in FIG. 11.

A display device of the first modification of the second embodiment can detect the respective electrical coupling states between connecting terminals 32 and 35, which are not used and are close to four corners of the driver IC of the face-down method, and third bumps 42 and fourth bumps 45 as dummy bumps, even if only one connecting terminal 32 is provided on one side. Accordingly, similar functions and effects to those of the first and second embodiments can be obtained.

Second Modification of Second Embodiment

Figure 13:
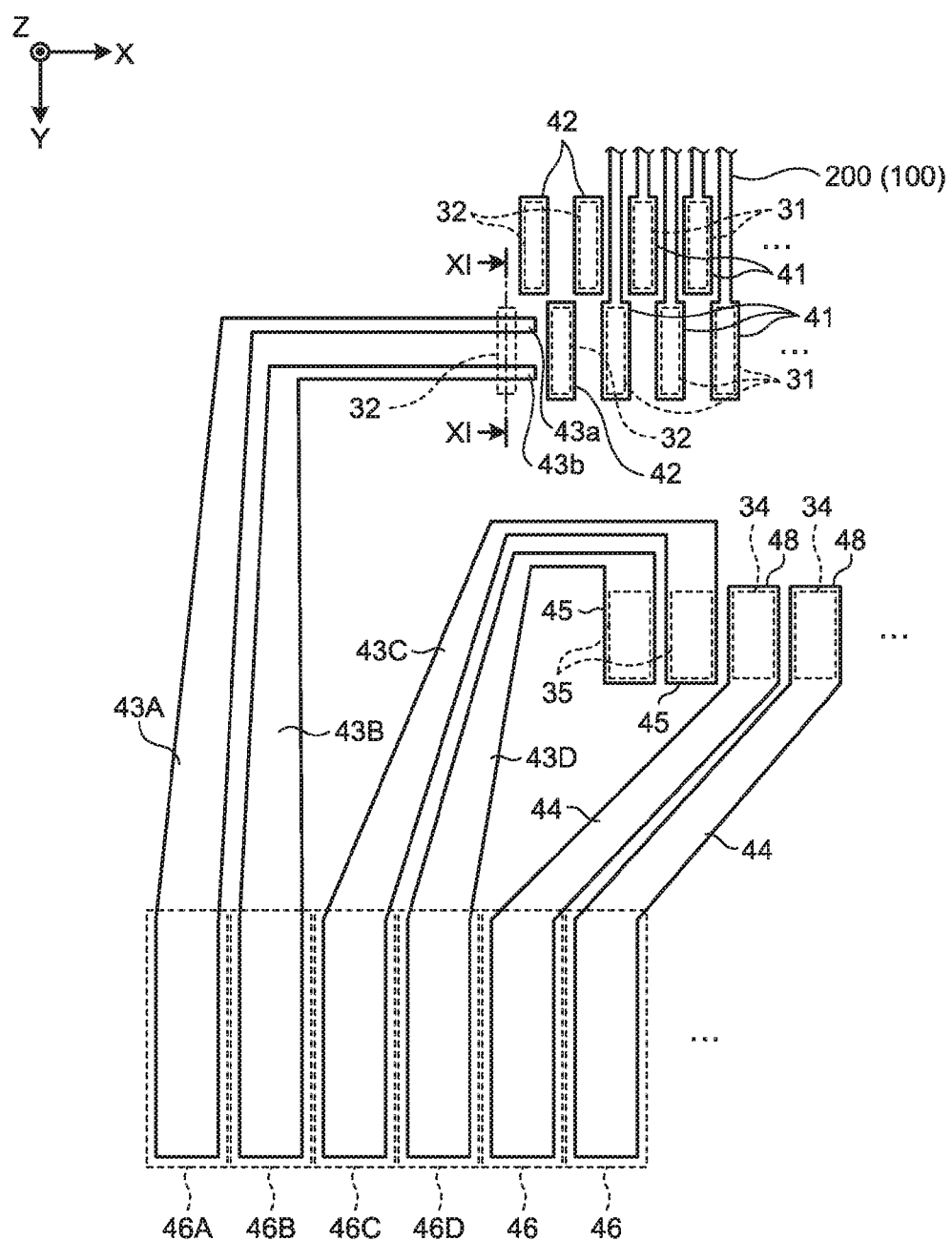
FIG. 13 is an enlarged schematic view illustrating connecting electrodes and wires of a substrate on which terminals of a driver IC according to a second modification of the second embodiment are mounted.

FIG. 13 is an enlarged schematic view illustrating connecting electrodes and wires of a substrate on which terminals of a driver IC according to a second modification of the second embodiment are mounted. The same configuration elements as those described in any of the first embodiment, the second embodiment, and the first modification of the second embodiment are denoted with the same reference signs, and overlapping description is omitted.

The arrangement illustrated in FIG. 13 can be mirror-inverted with respect to a Y direction, like FIG. 7, and thus only the left side is described. Therefore, two connecting terminals 32, a plurality of connecting terminals 31, and two connecting terminals 32 are sequentially arranged in an X direction in plan view.

As illustrated in FIG. 13, end portions of inspection wires 43A and 43B are third bumps 43a and 43b. Then, both the third bumps 43a and 43b overlap one connecting terminal 32 in plan view. That is, in the second modification of the second embodiment, the third bumps 43a and 43b overlap only outer one of two connecting terminals 32 provided in the same column in plan view. As a result, the third bumps 43a and 43b are short-circuited through the connecting terminal 32 if the electrical connecting between the third bumps 43a and 43b, and the connecting terminal 32 is established through a connecting conductor 49, as illustrated in FIG. 11.

A display device of the second modification of the second embodiment can detect the respective electrical coupling states between connecting terminals 32 and 35, which are not used and are close to four corners of the driver IC of the face-down method, and third bumps 42 and fourth bumps 45 as dummy bumps, as long as one connecting terminal 32 can be used even if the plurality of connecting terminals 32 are provided on one side. Accordingly, similar functions and effects to those of the first and second embodiments and the first modification of the second embodiment can be obtained.

Third Embodiment

Figure 14:
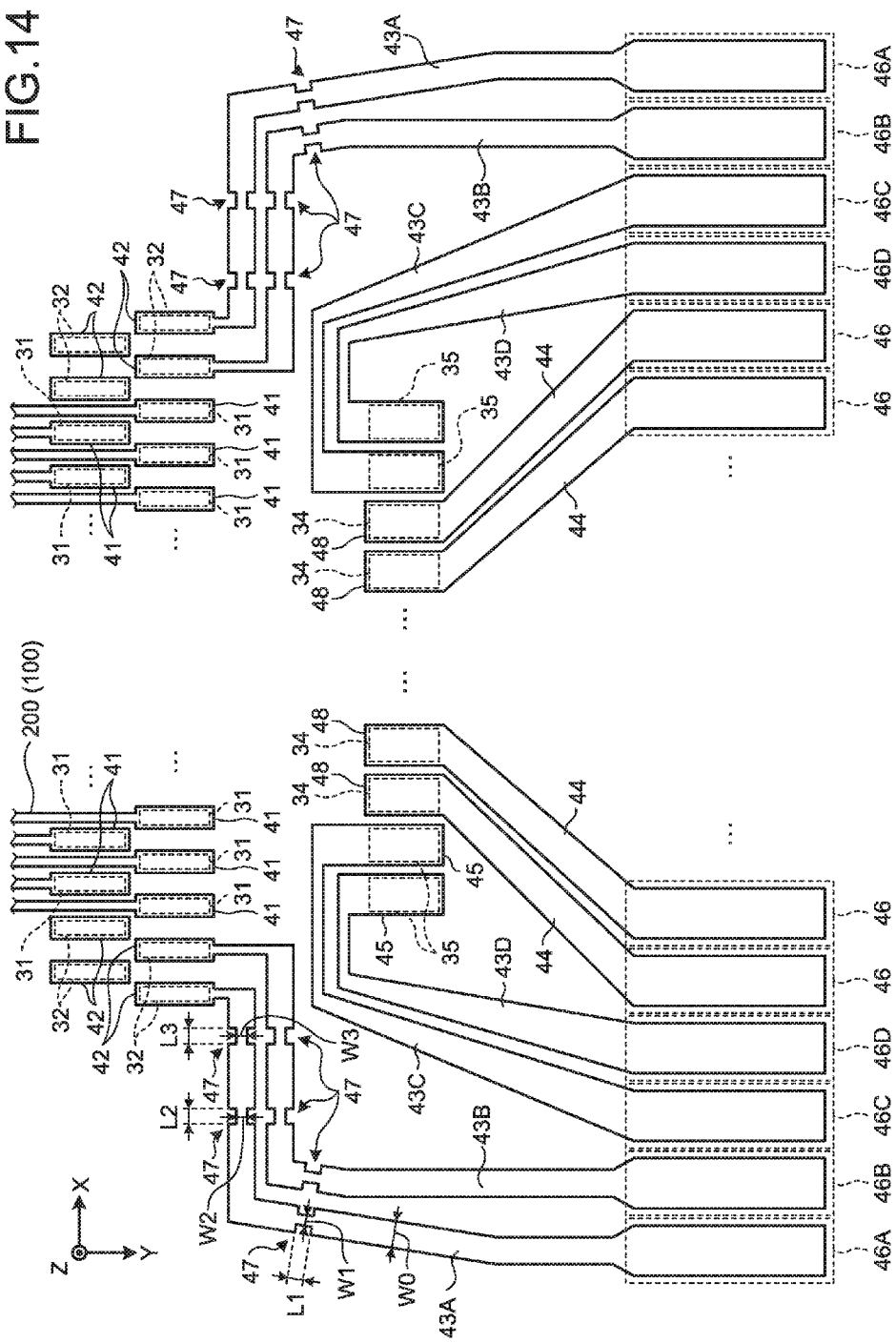
FIG. 14 is an enlarged schematic view illustrating connecting electrodes and wires of a substrate on which terminals of a driver IC according to a third embodiment are mounted.

FIG. 14 is an enlarged schematic view illustrating connecting electrodes and wires of a substrate on which terminals of a driver IC according to a third embodiment are mounted. The same configuration elements as those described in any of the first embodiment, the second embodiment, and the modifications of the second embodiment described above are denoted with the same reference signs, and overlapping description is omitted.

Similarly to the first embodiment, the driver IC in the third embodiment includes internal wires 39 that short-circuit connecting terminals 32 adjacent to each other inside the driver IC of a signal line drive circuit 23 illustrated in FIG. 6. As illustrated in FIG. 6, the connecting terminals 32 are positioned closer to a fifth surface 23e or a sixth surface 23f on a short side of the driver IC than connecting terminals 31 are positioned, in an X direction in plan view. Similarly to the first embodiment, a plurality of first bumps 41 and a plurality of third bumps 42 are arranged to form a plurality of columns, in the X direction in plan view. The third bumps 42, the first bumps 41, and the third bumps 42 are sequentially arranged, in the X direction in plan view. The connecting terminals 32 overlapping inspection wires 43A and 43B in plan view are provided inside in a short direction (Y direction) of the driver IC. The third embodiment includes the inspection wires 43A, 43B, 43C, and 43D, thereby detecting the respective electrical coupling states between connecting terminals 32 and 35, which are not used and are close to four corners of the driver IC of the face-down method, and third bumps 42 and fourth bumps 45 as dummy bumps.

By the way, the inspection wires 43A, 43B, 43C, and 43D may be electrically charged depending on an environment where the display device 1 is placed.

When the inspection wires 43C and 43D are electrically charged, even if the charge is transferred to the fourth bumps 45 so that static electricity is transferred to the second bumps 48, it is possible to prevent its influence on the display region 21, because there is an enough distance between the first bump 41 and the fourth bump 45. However, the distance between the first bump 41 and the third bump 42 is smaller than the distance between the first bump 41 and the fourth bump 45. Therefore, when the inspection wires 43A and 43B are electrically charged, the charge is transferred to the third bumps 42 so that static electricity may be transferred to the first bumps 41. When the static electricity is transferred to the first bumps 41, the static electricity may be transferred to the wires 200, which may destroy the thin film transistors Tr illustrated in FIG. 4.

Therefore, the inspection wires 43A and 43B of the third embodiment includes at least one fuse portion 47. To be specific, as illustrated in FIG. 14, the inspection wires 43A and 43B each have three fuse portions 47. The inspection wires 43A and 43B may each include five or ten fuse portions 47.

The fuse portion 47 corresponds to a part of each of the wires 43A and 43B that is narrower in width than a basic width W0 of the inspection wires 43A and 43B. A first narrow width portion has a length L1 and a width W1, a second narrow width portion has a length L2 and a width W2, and a third narrow width portion has a length L3 and a width W3. The ratio of the width to the length of the narrow width portion (W1/L1, W2/L2, or W3/L3) can be appropriately set. However, if the ratio is from about 1.5/100 to 20/100, there is a higher possibility that the fuse portion 47 sparks and breaks down in the range of a withstand voltage that occurs in the manufacturing process of the display device. The width W1, W2, or W3 is favorably 1.5 μm or more so that a conductor can be stably formed in an exposure device. The influence caused by the length L1, L2, or L3 on the withstand voltage of the fuse portion 47 is smaller than that is caused by the width W1, W2, or W3. However, the withstand voltage can be adjusted by making the lengths L1, L2, and L3 different from one another.

The inspection wires 43A and 43B are routed at the fixed basic width W0 without being made thick on the inspection bumps 46A and 46B sides, respectively, and the wiring area is made small, whereby the charge on the inspection wires 43A and 43B can be reduced.

The inspection wires 43A and 43B each including the fuse portions 47 extend near the first bumps 41. However, even if the inspection wires 43A and 43B are electrically charged, the fuse portions 47 sparks due to the charge before the charge is transferred to the third bumps 42. As a result, there is a lower possibility that static electricity is transferred to the first bumps 41, and there is a lower possibility that the static electricity is transferred to the wires 200, thereby destroying the thin film transistors Tr illustrated in FIG. 2.

First Modification of Third Embodiment

Figure 15:
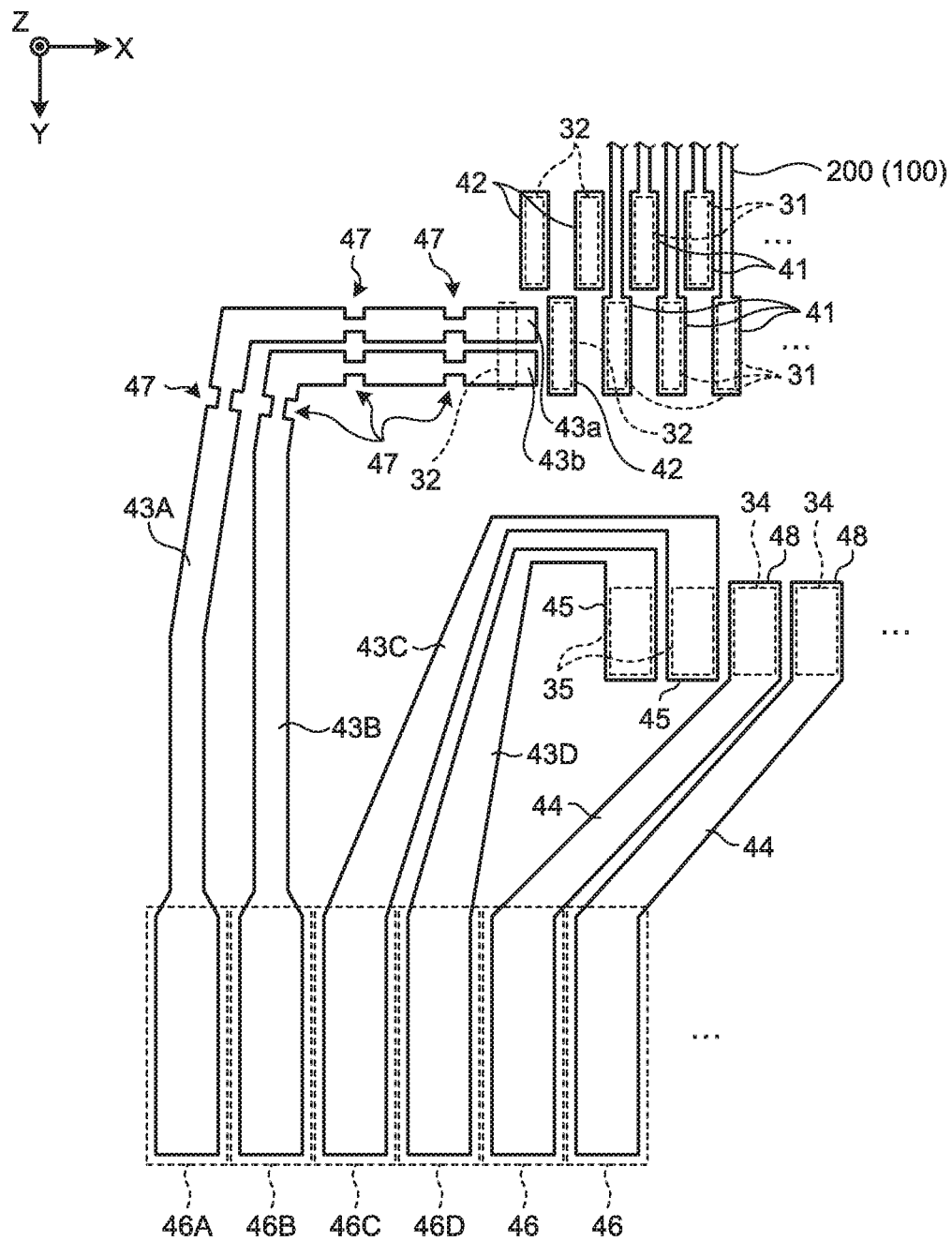
FIG. 15 is an enlarged schematic view illustrating connecting electrodes and wires of a substrate on which terminals of a driver IC according to a first modification of the third embodiment are mounted.

FIG. 15 is an enlarged schematic view illustrating connecting electrodes and wires of a substrate on which terminals of a driver IC according to a first modification of the third embodiment are mounted. The same configuration elements as those described in any of the first embodiment, the second embodiment, and the modifications of the second embodiment are denoted with the same reference signs, and overlapping description is omitted.

Similarly to the second modification of the second embodiment, the driver IC according to the first modification of the third embodiment does not include internal wires 39 that shorts-circuit connecting terminals 32 adjacent to each other inside a driver IC of a signal line drive circuit 23 illustrated in FIG. 6. Similarly to the second modification of the second embodiment, in the first modification of the third embodiment, both the third bumps 43a and 43b overlap only outer one of two connecting terminals 32 in the same column in plan view. Similarly to the second modification of the second embodiment, the third embodiment includes the inspection wires 43A, 43B, 43C, and 43D, thereby detecting the respective electrical coupling states between connecting terminals 32 and 35, which are not used and are close to four corners of the driver IC of the face-down method, and third bumps 42 and fourth bumps 45 as dummy bumps, as long as one connecting terminal 32 can be used even if the plurality of connecting terminals 32 are provided on one side. Accordingly, similar functions and effects to those of the first and second embodiments and the first modification of the second embodiment can be obtained.

The inspection wires 43A and 43B of the first modification of the third embodiment include at least one fuse portion 47. To be specific, as illustrated in FIG. 15, the inspection wires 43A and 43B each have three fuse portions 47.

The fuse portions 47 spark due to a charge before the charge is transferred to the third bumps 42. As a result, there is a lower possibility that static electricity is transferred to first bumps 41, and there is a lower possibility that the static electricity is transferred to wires 200, thereby destroying thin film transistors Tr illustrated in FIG. 2.

Evaluation of Third Embodiment

Figure 16A:
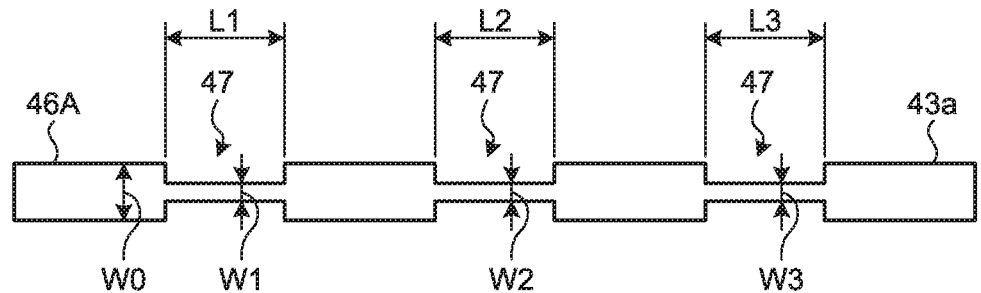
FIGS. 16A to 16C are explanatory diagrams for describing evaluation examples of the third embodiment.
Figure 16B:
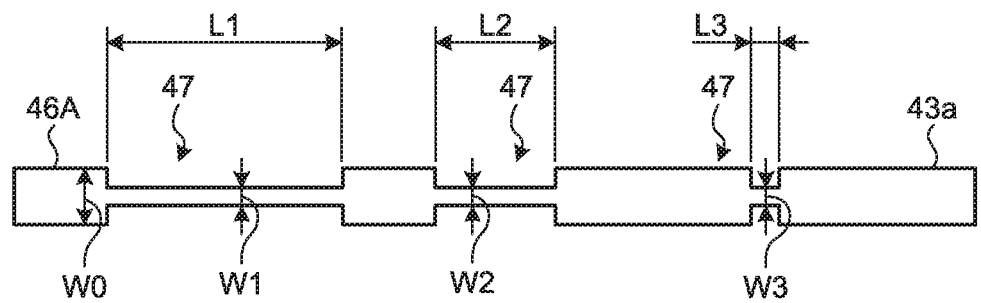
Figure 16C:
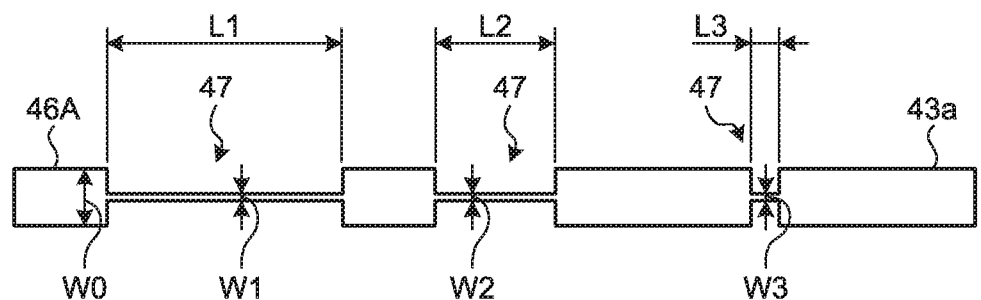

FIGS. 16A to 16C are explanatory diagrams for describing evaluation examples of the third embodiment. The same configuration elements as those described in the third embodiment are denoted with the same reference signs, and overlapping description is omitted.

FIG. 16A illustrates, as a first evaluation example, a schematic diagram where the inspection wire 43A is made straight. The three fuse portions 47 of the first evaluation example are arranged at uniform intervals in a length direction. W0 is 40 µm. The relation W1=W2=W3=10 µm holds, and the relation L1=L2=L3=100 µm holds.

FIG. 16B illustrates, as a second evaluation example, a schematic diagram where the inspection wire 43A is made straight. The fuse portions 47 of the second evaluation example are arranged such that the respective lengths are made different. W0 is 40 µm. The relation W1=W2=W3=10 µm holds. L1 is 200 µm, L2 is 100 µm, and L3 is 20 µm.

FIG. 16C illustrates, as a third evaluation example, a schematic diagram where the inspection wire 43A is made straight. The fuse portions 47 of the third evaluation example are arranged such that the width of the fuse portion 47 of the third evaluation example is made narrower than that of the fuse portion 47 of the second evaluation example. W0 is 40 µm. The relation W1=W2=W3=5 µm holds. L1 is 200 µm, L2 is 100 µm, and L3 is 20 µm.

A voltage of 1.0 kV or higher was applied between one end and the other end in the first to third evaluation examples, and the state of the fuse portions 47 after the application was observed with a microscope.

In the first evaluation example, no breakdown of the fuse portions 47 occurred even if 5.0 kV was applied between the one end and the other end. In the first evaluation example, breakdown of the fuse portions 47 was caused when 6.0 kV was applied between the one end and the other end.

In the second evaluation example, no breakdown of the fuse portions 47 occurred even if 2.5 kV was applied between the one end and the other end. In the second evaluation example, breakdown of the fuse portions 47 was caused when 3.0 kV was applied between the one end and the other end.

In the third evaluation example, no breakdown of the fuse portions 47 occurred even if 1.2 kV was applied between the one end and the other end. In the third evaluation example, breakdown of the fuse portions 47 was caused when 1.4 kV was applied between the one end and the other end.

As described above, a breakdown voltage can be defined by making the thickness of a part of the fuse portions 47 of the inspection wire thinner than the thickness of the other fuse portions.

Preferred embodiments of the present invention have been described. However, the present invention is not limited by these embodiments. The content disclosed in the embodiments is merely an example, and various modifications can be made without departing from the gist of the present invention. The appropriate modifications made without departing from the gist of the present invention obviously belong to the technical scope of the present invention.

For example, a liquid crystal display device has been described as the display device 1 of the embodiments. However, the display device 1 can be applied to a display device that lights a self-luminous body such as an organic light emitting diode (OLED). A plurality of driver ICs as the scanning line drive circuit 22 illustrated in FIG. 5 may be provided. The wires 100 illustrated in FIG. 5 may be arranged outside the fourth side 21d of the display region 21, instead of outside the second side 21b of the display region 21. The wires 100 illustrated in FIG. 5 may be arranged outside the fourth side 21d of the display region 21, in addition to outside the second side 21b of the display region 21. Further, the configuration elements of the above-described embodiments can be appropriately combined.

The present invention can naturally provide other advantageous effects that are provided by the aspects described in the embodiments above and are clearly defined by the description in the present specification or appropriately conceivable by those skilled in the art.

What is claimed is:

1. A display device comprising:
   a substrate including a display region and a non-display region that is disposed on a periphery of the display region;
   at least one driver IC including a plurality of connecting terminals, and having a first surface that is fixed to face the non-display region;
   a plurality of first wires that supply a signal to the display region;
   a plurality of first bumps electrically connected with the respective first wires;
   a plurality of second wires that input and output a signal from and to an outside;
   a plurality of second bumps electrically connected with the respective second wires;
   a plurality of inspection wires; and
   a plurality of inspection bumps electrically connected with the respective inspection wires, wherein
   the connecting terminals of the at least one driver IC comprise a plurality of first connecting terminals overlapping the respective first bumps or the respective second bumps in plan view, and a plurality of second connecting terminals not overlapping the first bumps or the second bumps in plan view,
   the inspection wires include a connecting conductor between themselves and at least one of the second connecting terminals, and are pulled out to an outside of the at least one driver IC in plan view, and
   a first end of each of the inspection wires is electrically connected with one of the inspection bumps, and a set of second ends of two of the inspection wires overlaps with at least one of the second connecting terminals in plan view.

2. The display device according to claim 1, wherein
   the connecting terminals are arranged to form a plurality of columns in a longitudinal direction of the at least one driver IC in plan view, and
   the second connecting terminals overlapping the inspection wires in plan view are arranged in inside columns among the columns in a short direction of the driver IC.

3. The display device according to claim 1, wherein one of the second connecting terminals, the first connecting terminals, and one of the second connecting terminals are sequentially arranged in a longitudinal direction of the at least one driver IC in plan view.

4. The display device according to claim 1, wherein the second connecting terminals, the first connecting terminals, and the second connecting terminals are sequentially arranged in a longitudinal direction of the at least one driver IC in plan view.

5. The display device according to claim 1, wherein the second connecting terminals are closer to a short side of the at least one driver IC than the first connecting terminals are, in a longitudinal direction of the at least one driver IC in plan view.

6. The display device according to claim 1, wherein eight of the inspection wires are pulled out to an outside of the at least one driver IC in plan view.

7. The display device according to claim 1, wherein the set of the second ends of two of the inspection wires overlaps two or more of the second connecting terminals in plan view.

* * * * *